United States Patent
DeVilliers et al.

(10) Patent No.: US 8,512,938 B2
(45) Date of Patent: *Aug. 20, 2013

(54) METHODS OF FORMING A PATTERN IN A MATERIAL AND METHODS OF FORMING OPENINGS IN A MATERIAL TO BE PATTERNED

(75) Inventors: Anton DeVilliers, Boise, ID (US); Michael Hyatt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 325 days.

This patent is subject to a terminal disclaimer.

(21) Appl. No.: 12/815,181

(22) Filed: Jun. 14, 2010

(65) Prior Publication Data
US 2011/0305997 A1     Dec. 15, 2011

(51) Int. Cl.
*G03F 7/20* (2006.01)
(52) U.S. Cl.
USPC ........................................ 430/323
(58) Field of Classification Search
USPC ............. 430/394, 5, 322, 323, 324, 311, 314
See application file for complete search history.

(56) References Cited

U.S. PATENT DOCUMENTS

| | | | |
|---|---|---|---|
| 6,934,007 B2 | 8/2005 | Fritze et al. | |
| 7,247,574 B2 | 7/2007 | Broeke et al. | |
| 2006/0181665 A1* | 8/2006 | Hirota | 349/141 |
| 2007/0218673 A1 | 9/2007 | Nakamura | |
| 2007/0238308 A1 | 10/2007 | Niroomand et al. | |
| 2009/0142932 A1 | 6/2009 | Jung | |
| 2009/0258318 A1* | 10/2009 | Chan | 430/312 |
| 2010/0035192 A1* | 2/2010 | Ando et al. | 430/325 |

* cited by examiner

*Primary Examiner* — Brittany Raymond
(74) *Attorney, Agent, or Firm* — Dickstein Shapiro LLP

(57) ABSTRACT

Methods of forming a pattern in a material and methods of forming openings in a material to be patterned are disclosed, such as a method that includes exposing first portions of a first material to radiation through at least two apertures of a mask arranged over the first material, shifting the mask so that the at least two apertures overlap a portion of the first portions of the first material, and exposing second portions of the first material to radiation through the at least two apertures. The first portions and the second portions will overlap in such a way that non-exposed portions of the first material are arranged between the first portions and second portions. The non-exposed or exposed portions of the first material may then be removed. The remaining first material may be used as a photoresist mask to form vias in an integrated circuit. The pattern of vias produced have the capability to exceed the current imaging resolution of a single exposure treatment.

20 Claims, 13 Drawing Sheets

METHODS OF FORMING A PATTERN IN A MATERIAL AND METHODS OF FORMING OPENINGS IN A MATERIAL TO BE PATTERNED

FIELD OF THE INVENTION

Embodiments described herein relate generally to the fabrication of integrated circuits, and more specifically, at least one embodiment relates to the fabrication of vias in an integrated circuit using multiple exposures.

BACKGROUND OF THE INVENTION

Electrically conductive lines and connections form many common components of integrated circuits. Dynamic random access memory (DRAM) circuitry, for example, incorporates multiple parallel conductive lines to form word-lines and bit-lines, which are connected by electrical connectors to various components. In order to increase capacity and accommodate smaller devices, there is constant pressure to increase the density of components on these and other circuits. The continual reduction in feature size places greater demands on the techniques used to form the features.

Photolithography is a commonly used technique for patterning integrated circuit features, such as conductive lines and vias that may be filled with a conductive material to form a connection. One example of a photolithographic method for patterning integrated circuit features includes depositing a photoresist material over a material to be patterned, covering portions of the photoresist material with a mask, exposing the uncovered photoresist material to light, and etching away either the exposed portion, in the case of a positive resist, or the unexposed portion of the photoresist material, in the case of a negative resist. The remaining photoresist material is used as an etch mask for an etching process. In the etching process, portions of the of the material to be etched that are not covered by the photoresist material are removed by, for example, wet or dry chemical etch. After the etch, the remaining photoresist material is dissolved.

There are, however, limitations on how close features, such as vias in which electrical connectors may be formed, can be patterned using known photolithographic techniques. The size of features on an integrated circuit are conventionally described by their "pitch," which is the distance between an identical point on two neighboring features. Due to an inherent resolution limit, which is a function of a numerical aperture of the mask and the wavelength of the light used, there is a minimum pitch below which features cannot be reliably formed using conventional photolithographic techniques.

Thus, there exists a need for a method and apparatus to pattern closely spaced features, e.g., vias, which may include electrical contacts, having a smaller pitch than would be possible using a mask having a given resolution limit in a conventional photolithographic technique.

DETAILED DESCRIPTION

The term "substrate" in the following description refers to any supporting material suitable for fabricating an integrated circuit, typically a semiconductor material, but not necessarily so. A substrate may be silicon-based, may include epitaxial layers of silicon supported by a base semiconductor foundation, may be a layer of semiconductor material itself, can be sapphire-based, silicon-on-insulator (SOI), metal, polymer, quartz, or any other materials suitable for supporting an integrated circuit or mask formation. When reference is made to a semiconductor substrate in the following description, previous process steps may have been utilized to form regions or junctions in or over a base semiconductor. The terms "removable" and "non-removable" as used herein relate to portions of a material that either will be removed or will not be removed, respectively, by a subsequent step, for example by treating the material with a solvent.

In various embodiments described herein, a mask having a pattern is used during a first exposure of a photoresist material. The mask is shifted and a second exposure of the photoresist is performed. The first and second exposures overlap to yield a grid of non-exposed areas on the photoresist, which may be removed using a negative develop technique. In various embodiments, the non-exposed areas may be etched into vias to be filled with conductive material and used, e.g., as electrical contacts to connect to closely spaced access lines, such as access lines, data/source lines, bit-lines, etc. The pattern of vias produced has the capability to exceed the current resolution of a prior art single exposure treatment. The disclosed embodiments are particularly well suited for application to processor and memory technologies, such as, e.g., dynamic random access memory (DRAM) and other memory devices. The disclosed embodiments are also suitable for other integrated circuit structures having closely spaced electrical contacts. It should be understood that the embodiments discussed herein are not limited by the examples described herein and that changes can be made thereto.

An example embodiment is now described with reference to the accompanying figures wherein like reference numbers are used consistently for like features throughout the drawings. FIGS. 1-9 show steps in a method of making a grid of vias according to an embodiment described herein.

Figure 1:
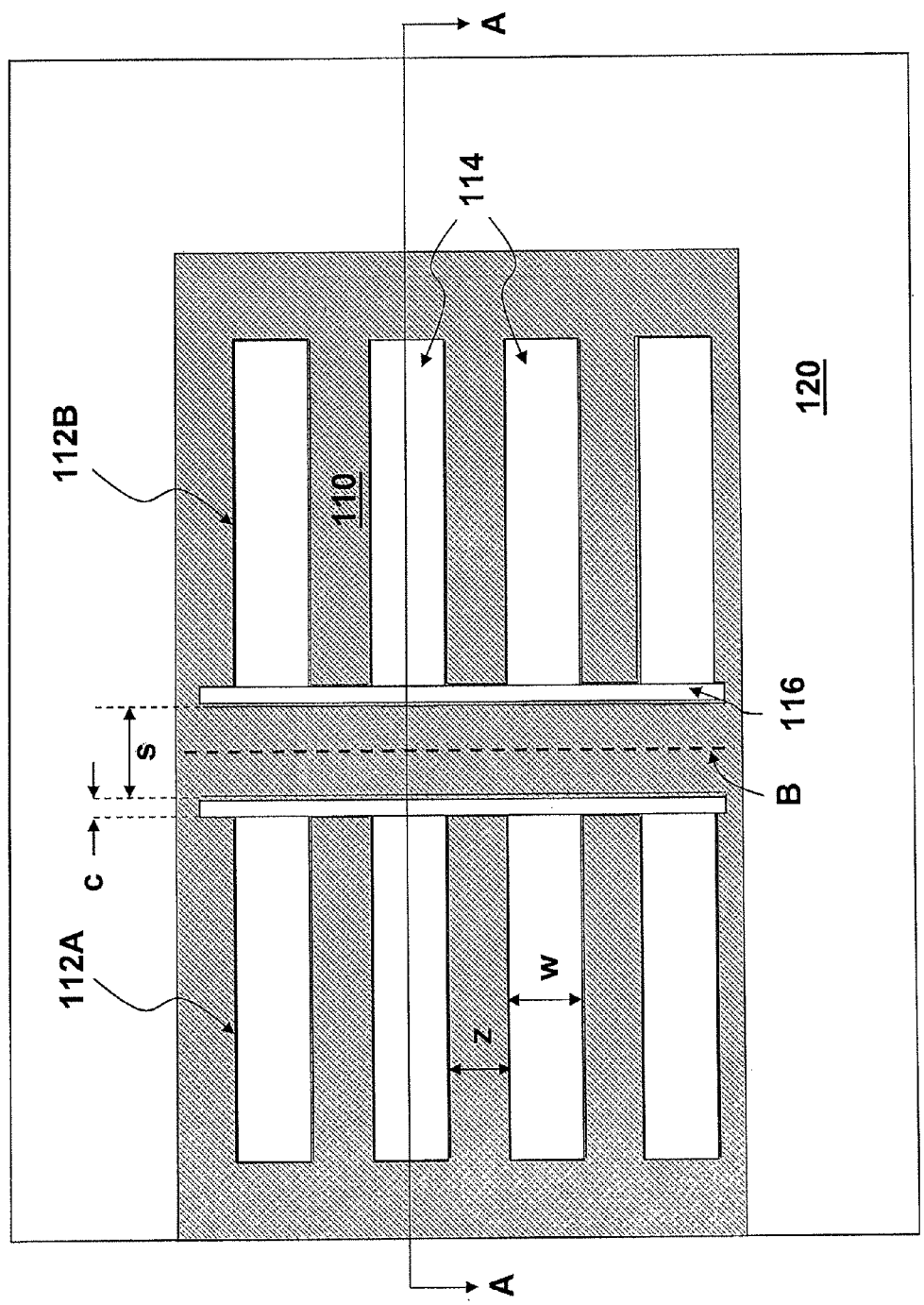
FIGS. 1 through 9 illustrate steps in a photolithographic method of forming vias in a substrate using a first mask embodiment according to an embodiment described herein.
Figure 2:
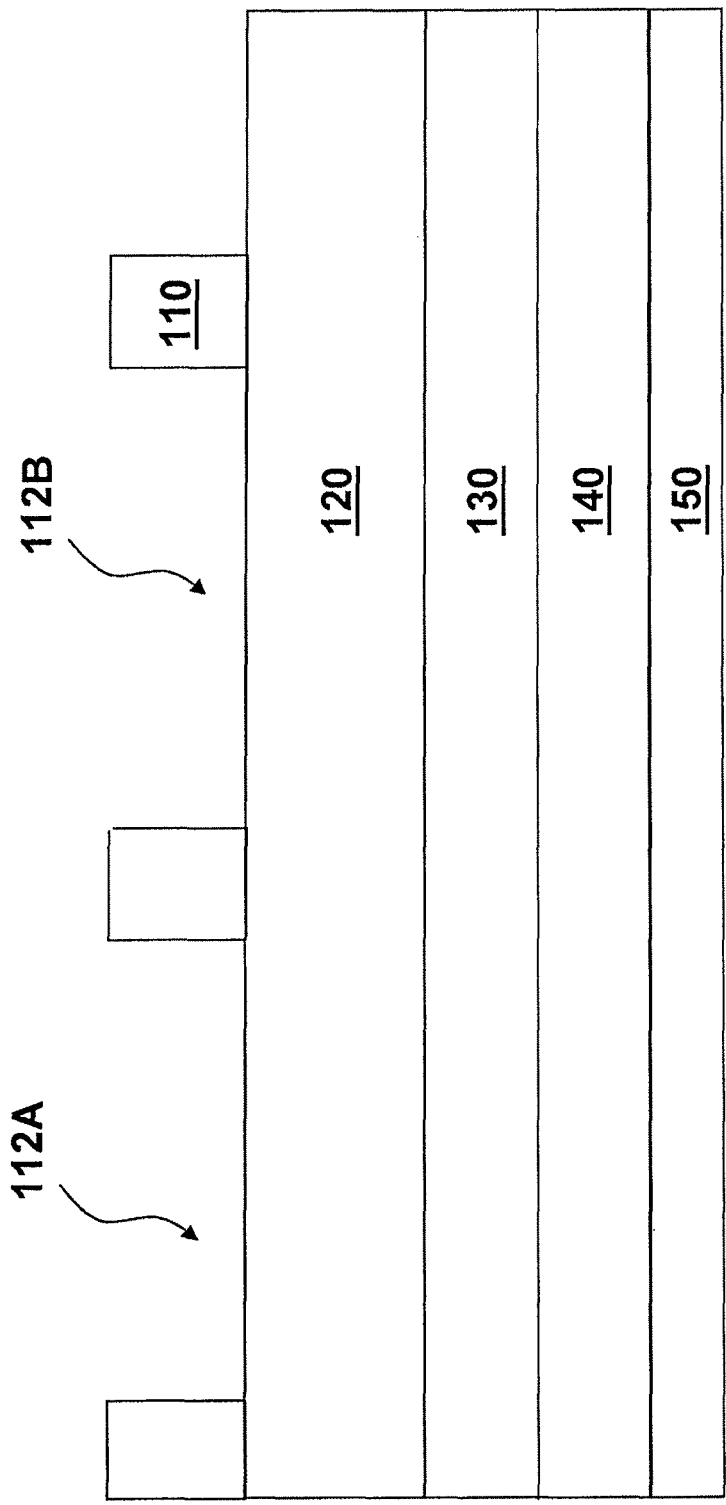

FIG. 1 illustrates a top down view and FIG. 2 shows a cut-away side view along line A-A of a mask 110 arranged over a stack of materials including a substrate 150, a conductive material 140 layer, such as a metal or a metal silicide, a dielectric material 130, such as an oxide, and a negative photoresist material 120, such as SU-8. The conductive layer 140 may include, for example, a single layer of conductive material or may include a plurality of conductive lines. It should be understood that the materials described for FIGS. 1 and 2 are examples only and the stack could include any number of different materials.

The mask 110 includes a plurality of apertures 112A, 112B formed therein. As used herein, an "aperture" can refer to, for example, an opening extending partially or completely through the mask, or any other feature configured to purposefully allow certain radiation, or portions thereof, to pass through the mask. In the embodiment shown in FIG. 1, there are two apertures 112A and 112B that are shaped as mirror images of each other across line B. Each of the apertures 112A, 112B includes a plurality of finger apertures 114 joined by a cross-connecting aperture 116 arranged substantially perpendicularly to and at one edge of the finger apertures 114.

Figure 9:
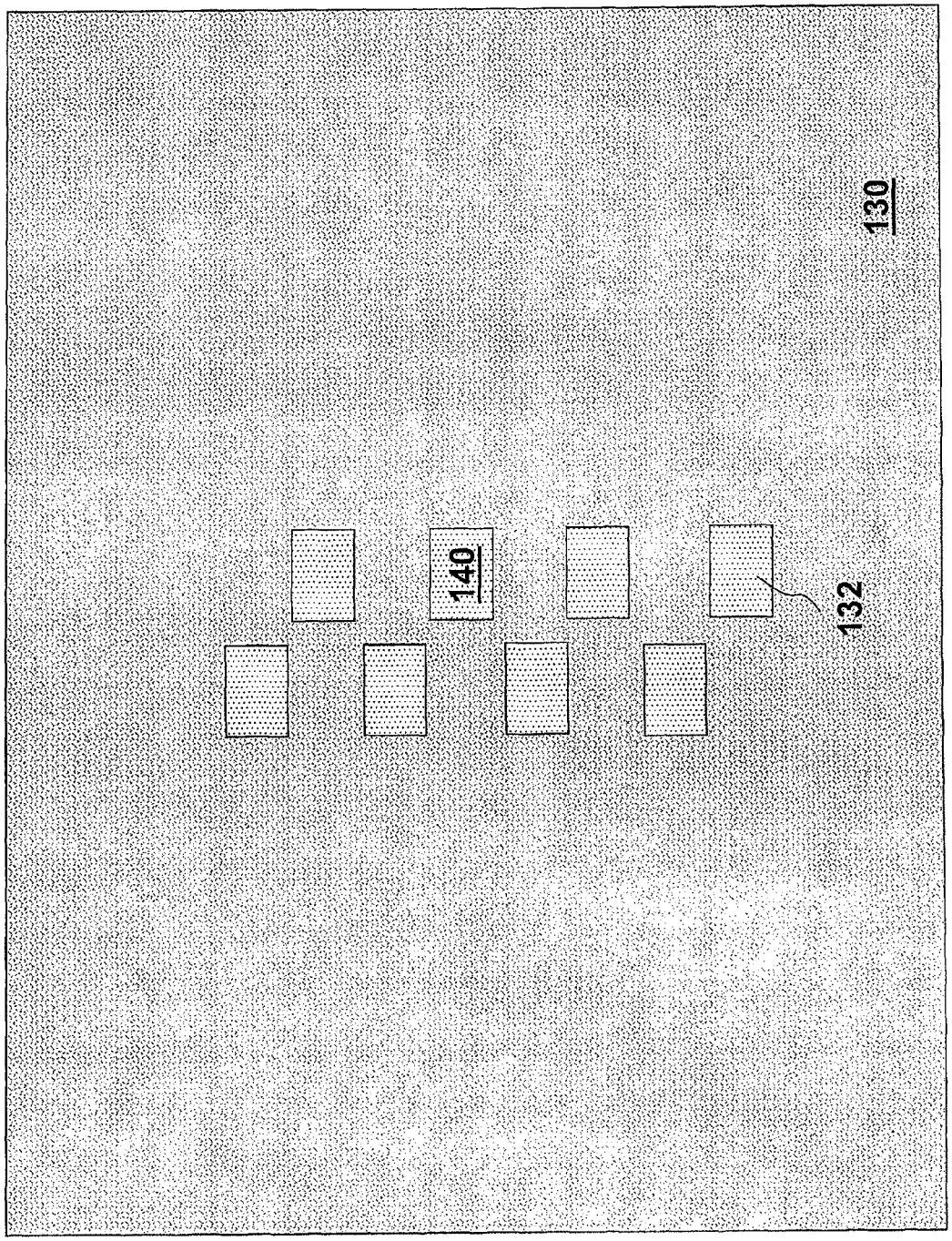
Figure 13:
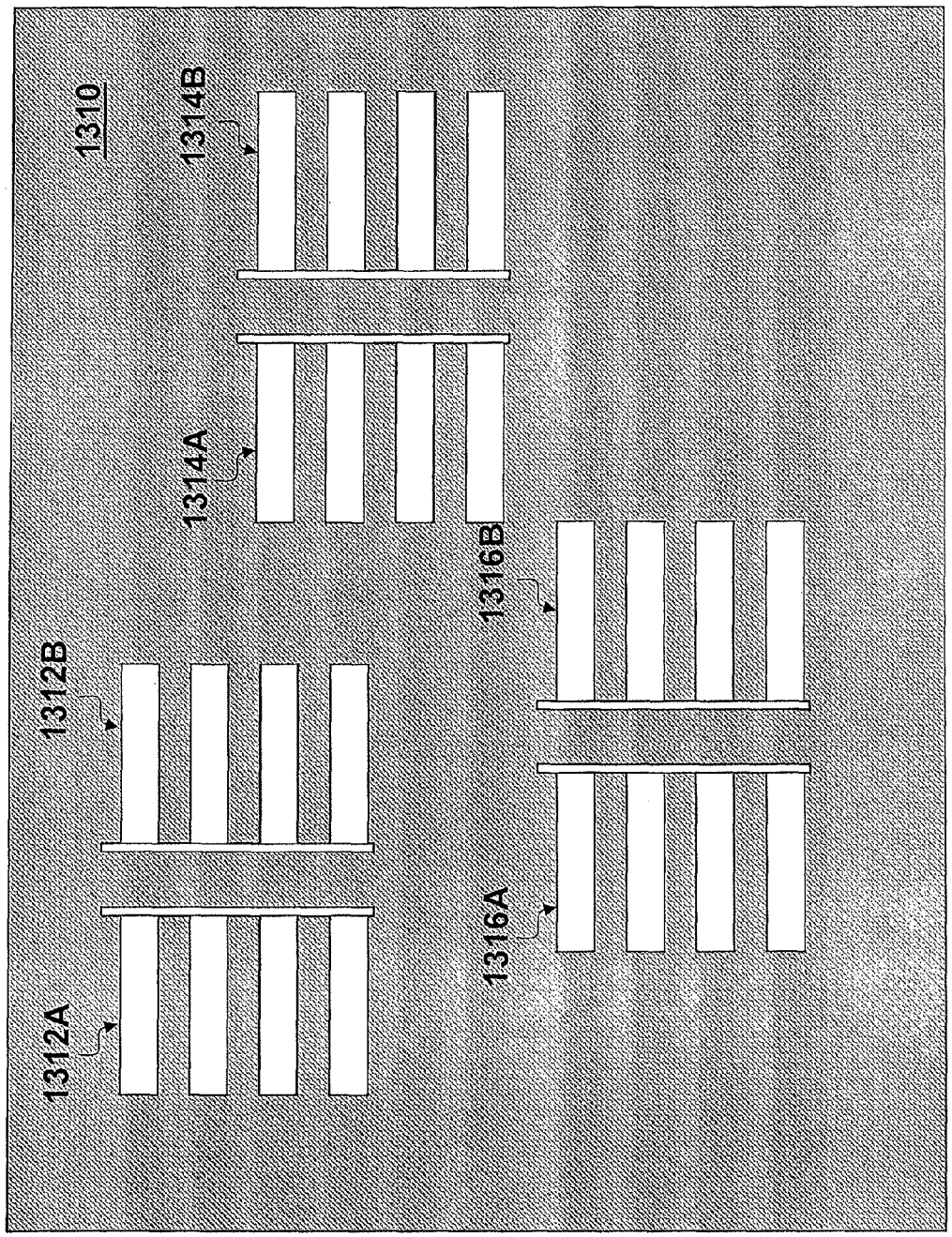
FIG. 13 illustrates a mask in accordance with another mask embodiment described herein that may be used in the method described with reference to FIGS. 1-9.

In the embodiment shown in FIG. 1, the apertures 112A, 112B each have four finger apertures 114. In other embodiments, the apertures 112A and 112B may have fewer or a greater number of finger apertures 114, for example, two, three, five, six, or more. In various embodiments, the width of the fingers w, the width of the cross-connector aperture c, and the spacing between the apertures s, may all be modified as desired. In the embodiment shown in FIG. 1, the width w of the finger apertures 114 is greater than the width z of the portion of the mask 110 separating the finger apertures 114. In yet other embodiments, the shape of the finger apertures 114 may be modified to change the shape of the final vias 132 (FIG. 9). In the embodiment shown in FIG. 13, multiple pairs of corresponding apertures 1312A, 1312B, 1314A, 1314B, 1316A, and 1316B can be arranged in a single mask 1310 to form contacts at various locations on a single integrated circuit or on a number of integrated circuits arranged on a same die. The pattern shift for the two exposures can also be used to adjust final via shape and size.

Figure 3:
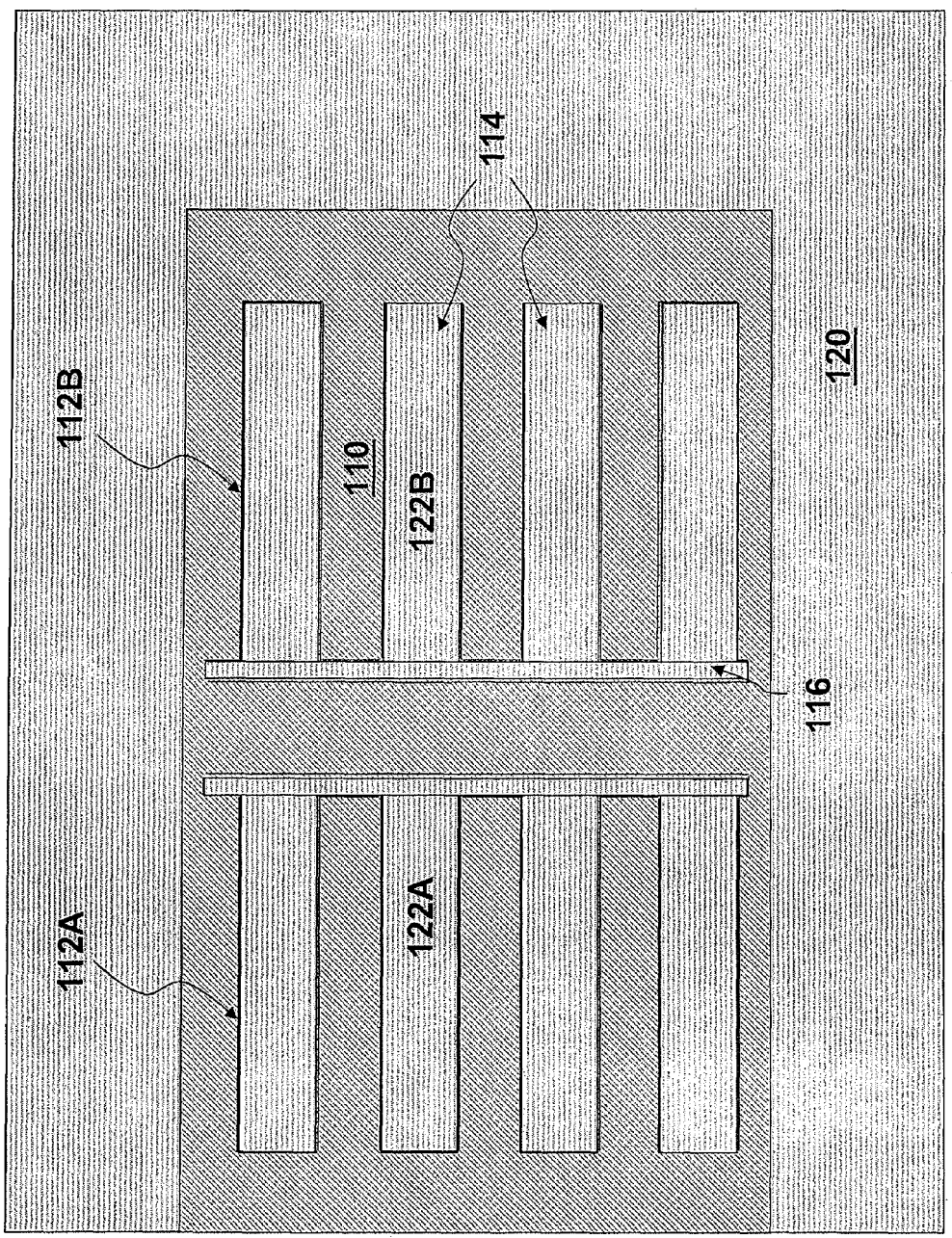
Figure 4:
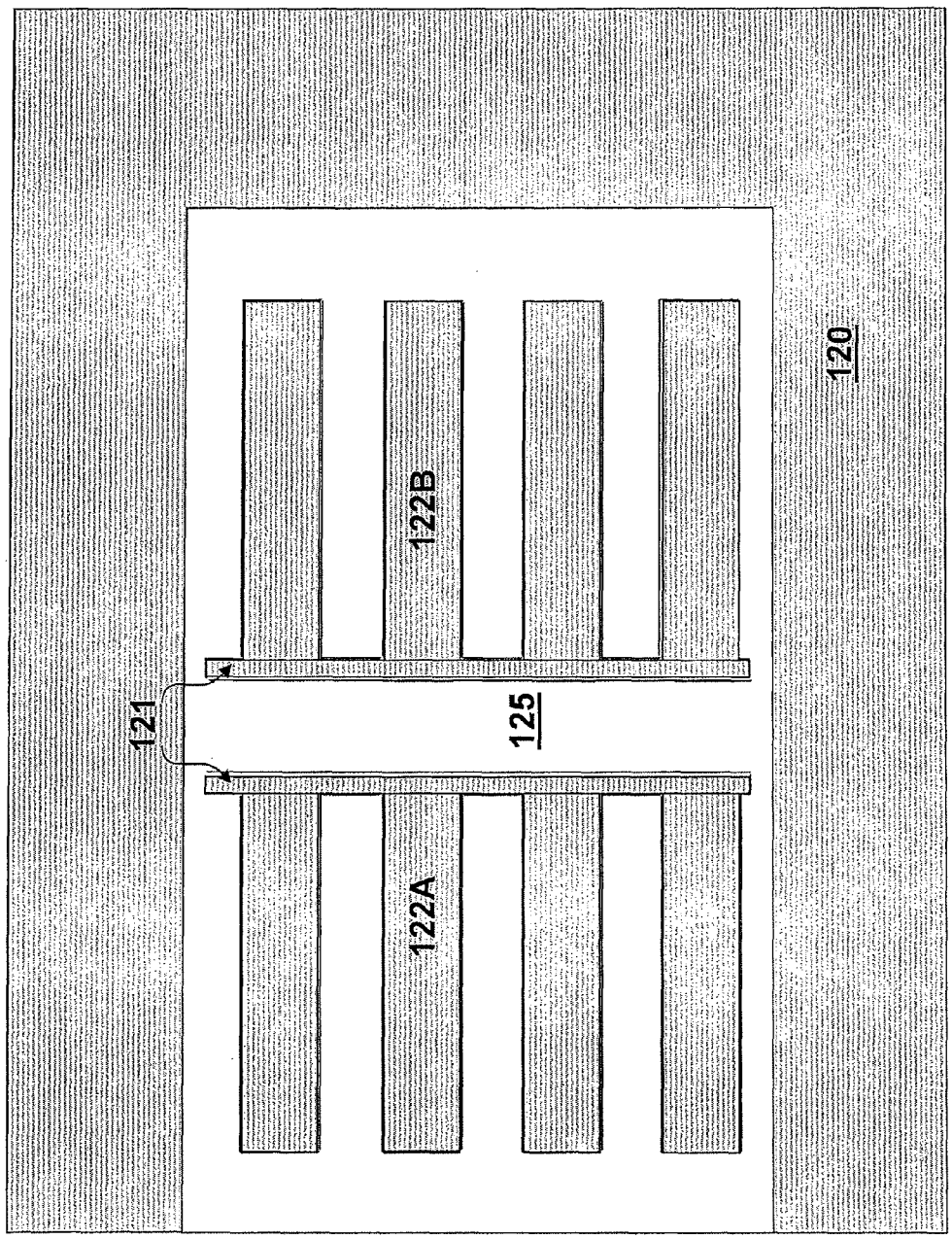

As shown in FIG. 3, the photoresist material 120 is exposed to radiation, such as light, during a first exposure step. First portions 122A, 122B of the photoresist material 120 receiving certain radiation through the apertures 112A, 112B and areas outside the mask 110 are formed into a pattern 121 (FIG. 4) that remains substantially intact after the photoresist material 120 is treated, for example, by a solvent in a later step. FIG. 4 shows the photoresist material 120 underneath the mask 110. Areas 125 of the photoresist material 120 not exposed to the radiation will not be removed by a later step.

Figure 5:
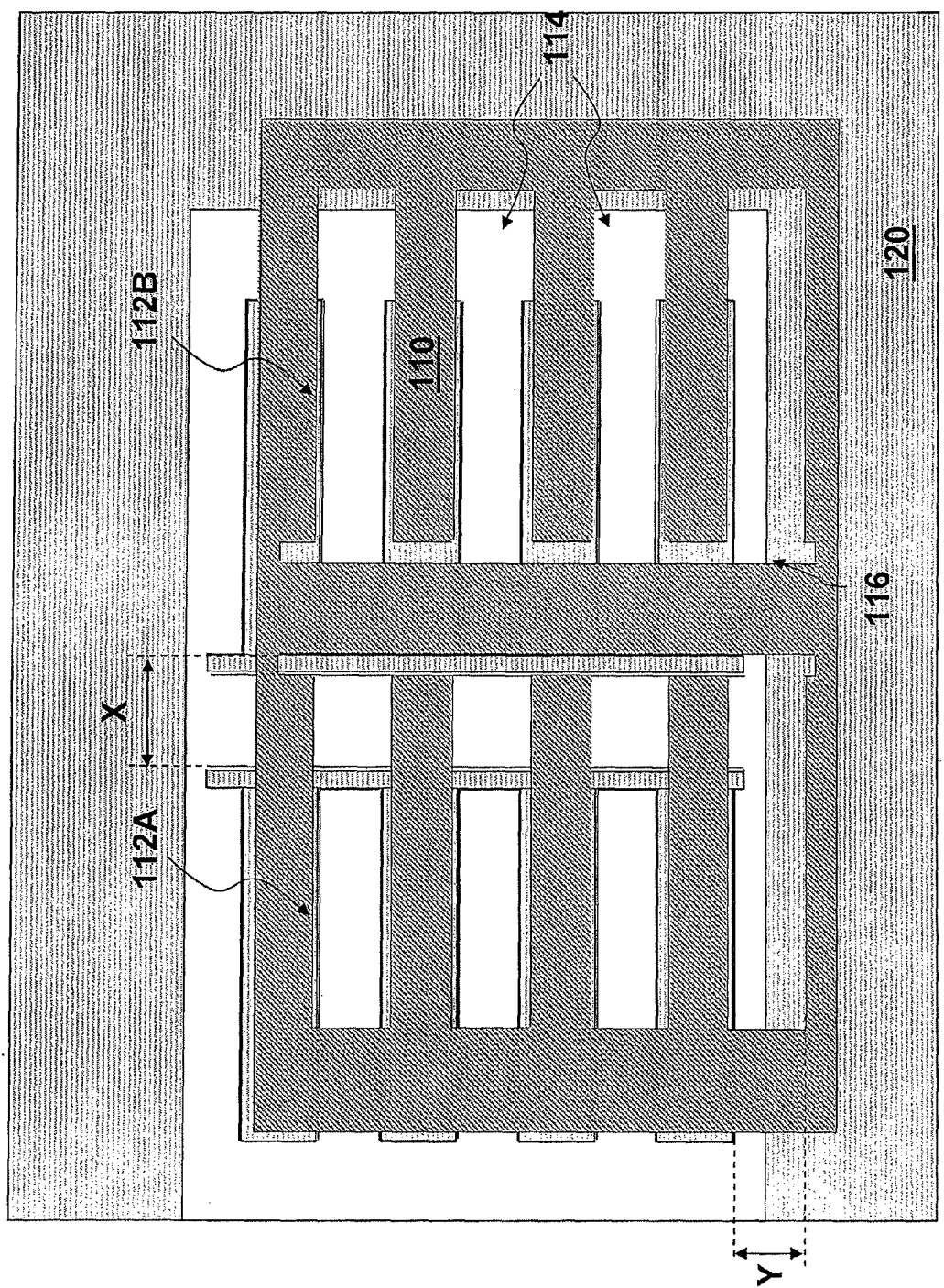

As shown in FIG. 5, the mask 110 is shifted relative to the first pattern 121 so that, for example, the apertures 112A, 112B in the mask 110 overlap some part of the first portions 122A, 122B of the first pattern 121. In the embodiment shown in FIG. 5, the mask 110 is shifted to the right relative to the first pattern 121 by a distance X and down relative to the first pattern 121 by a distance Y.

Figure 6:
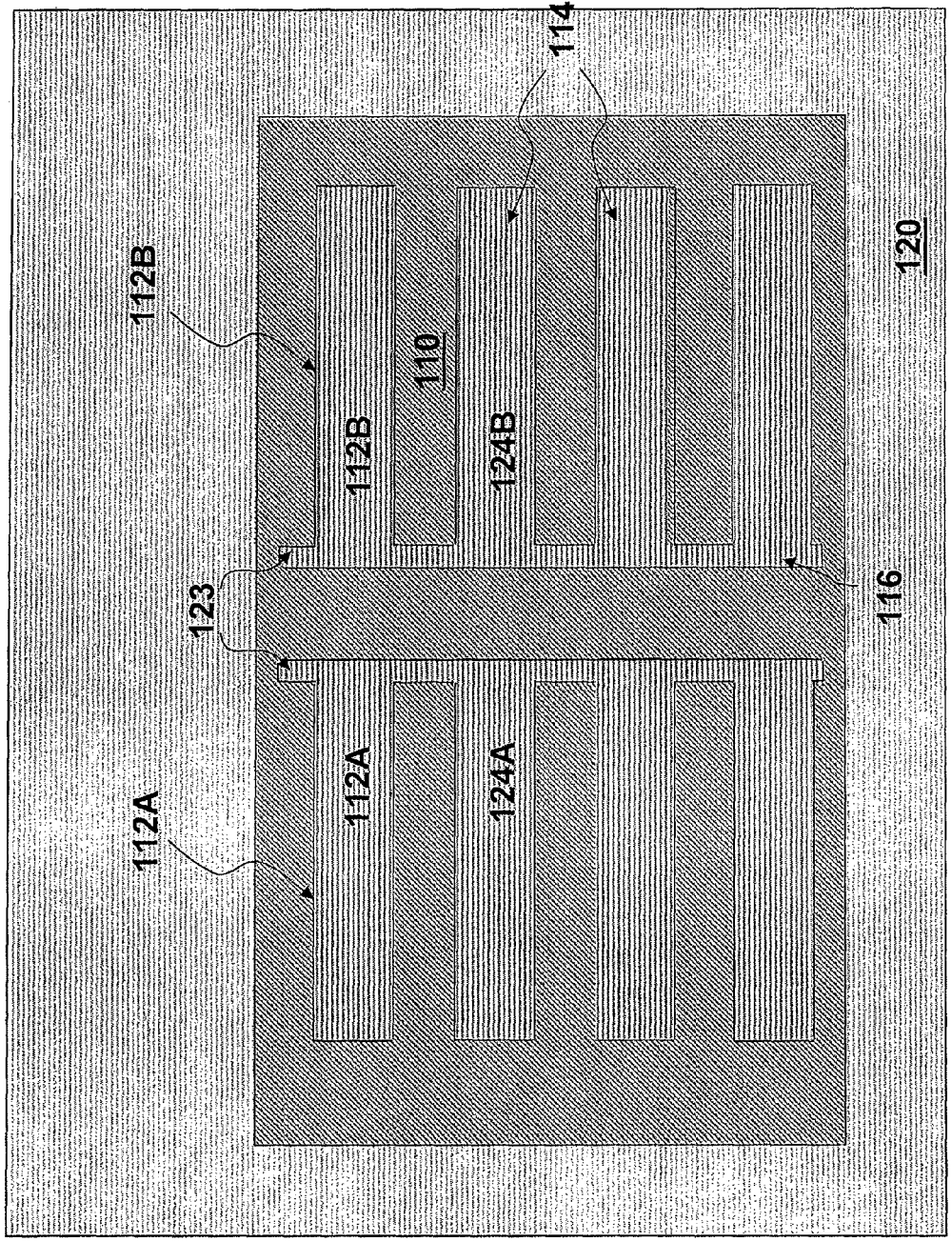

As shown in FIG. 6, the photoresist material 120 is exposed to radiation during a second exposure step. Second portions 124A, 124B of the photoresist material 120 receiving certain radiation through the apertures 112A, 112B are formed into a second pattern 123, overlapping the first portions 122A, 122B of the first pattern 121, that remains substantially intact after treatment (e.g., developing).

Figure 7:
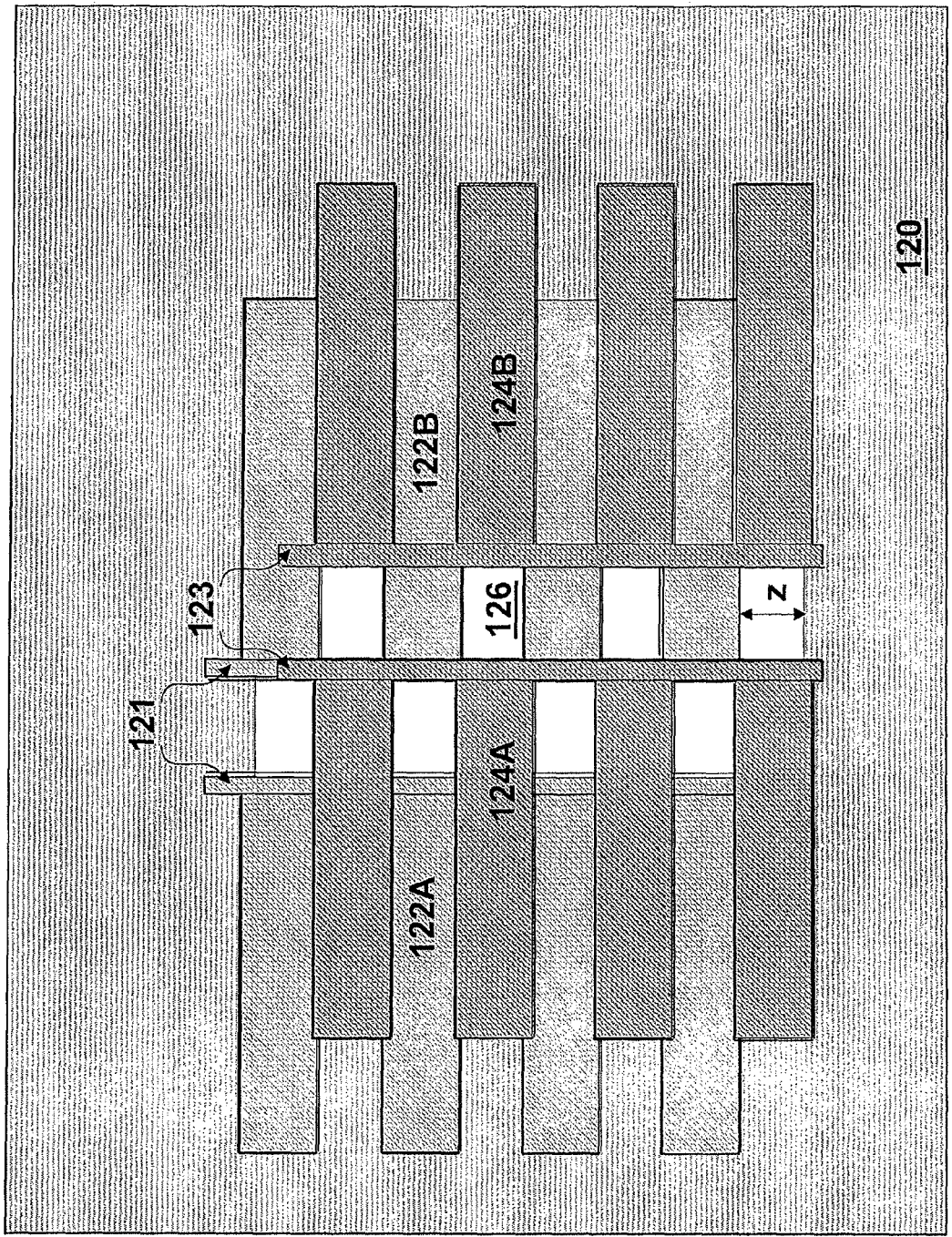

As shown in the top down view of FIG. 7, the mask 110 (FIG. 6) is removed over from the photoresist material 120. The unexposed portions 126 of the photoresist material 120 arranged between the first pattern 121 and second pattern 123 are removable and form the footprints for the areas to be etched into vias. Due to the shifting of the mask, the height z of the unexposed portions 126 is equal to the distance z separating the horizontal apertures (FIG. 1). Exposure, dose, and illumination will also influence height and width of unexposed regions. Adjustments or variation in the height of the unexposed portions z can be used to modify unexposed dimensions.

Figure 8:
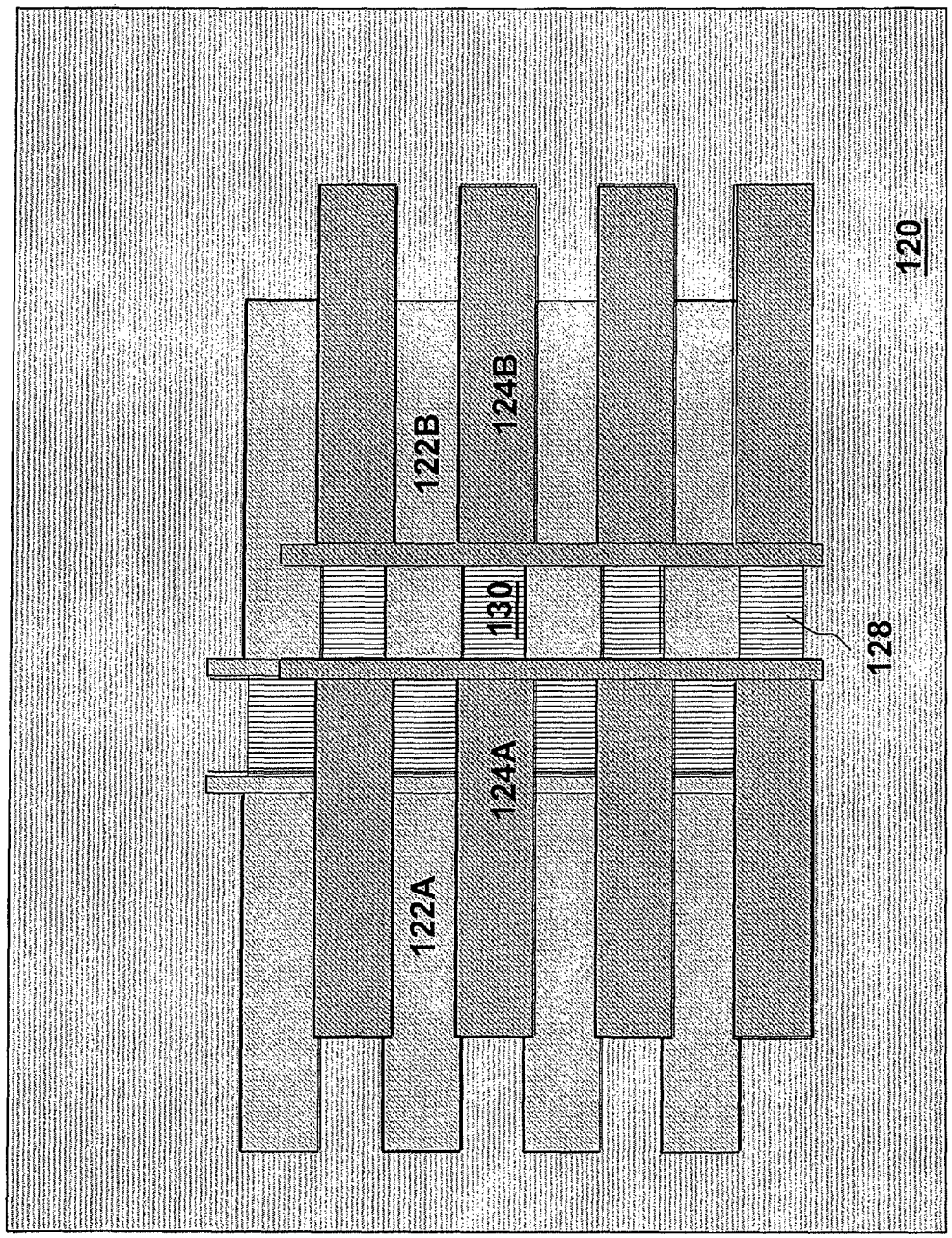

As shown in the top down view of FIG. 8, the unexposed portions 126 (FIG. 7) of the photoresist material 120 are removed using methods known in the art, such as treating with a solvent, to form openings 128 in the photoresist material 120 to expose the dielectric material 130. The dielectric material 130 is then etched using the remaining photoresist material 120 as a mask, such as using either a wet or dry chemical etch to form the vias 132 in the dielectric material 130 and expose the conductive layer 140. As shown in the top down view of FIG. 9, the remaining photoresist 120 is removed to expose the dielectric material 130 having a plurality of vias 132 formed therein. The vias 132 may then be filled with conductive material as is known in the art to form electrical connections to portions of the conductive layer 140. As discussed above, the conductive layer 140 may be made up of a plurality of closely spaced conductive lines (not shown) to which the conductive material in the vias 132 may be connected. Additional conductive materials or other features may be formed over the electrical connections.

Figure 10:
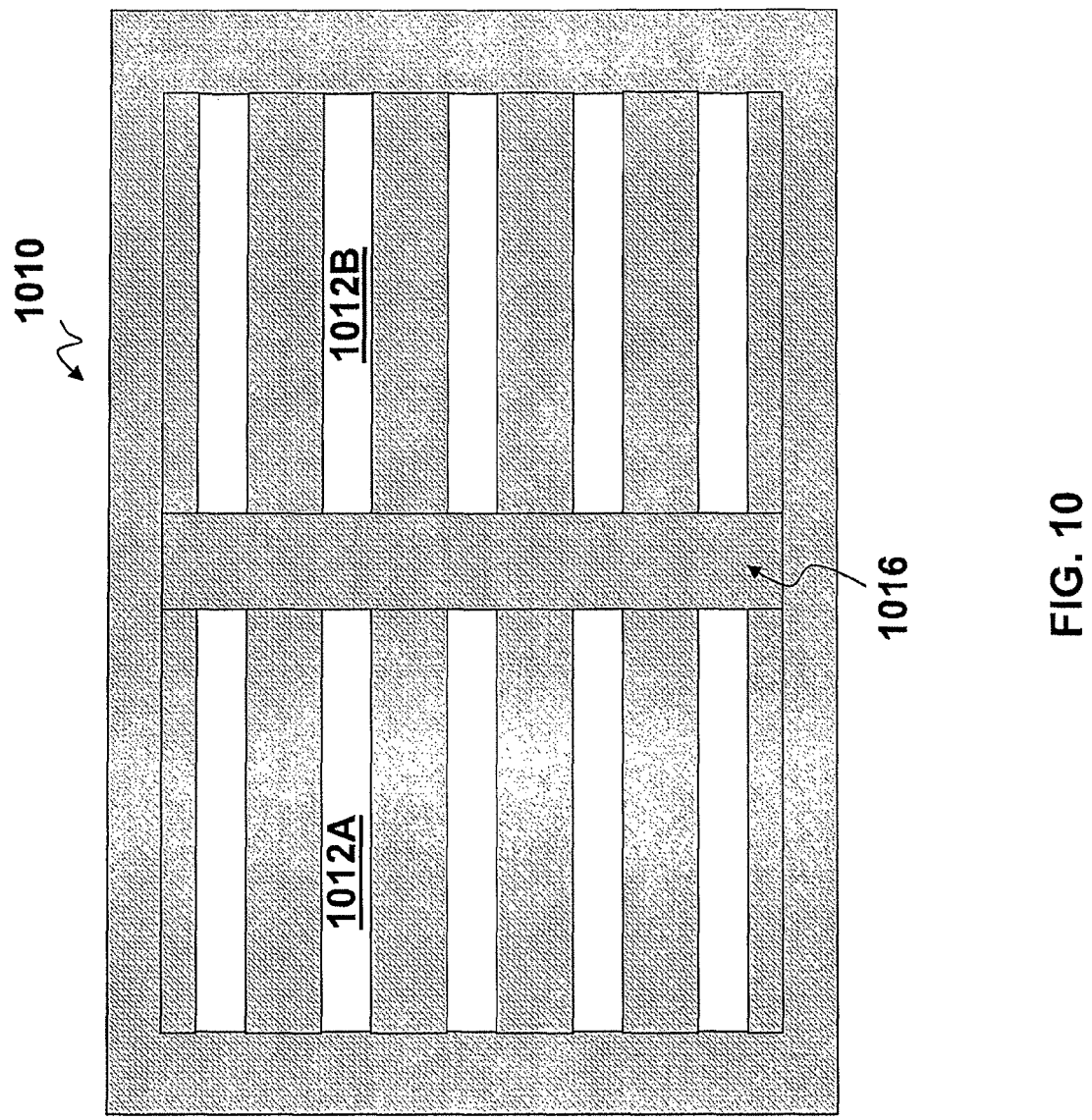
FIG. 10 illustrates a mask in accordance with another mask embodiment described herein that may be used in the method described with reference to FIGS. 1-9.
Figure 11:
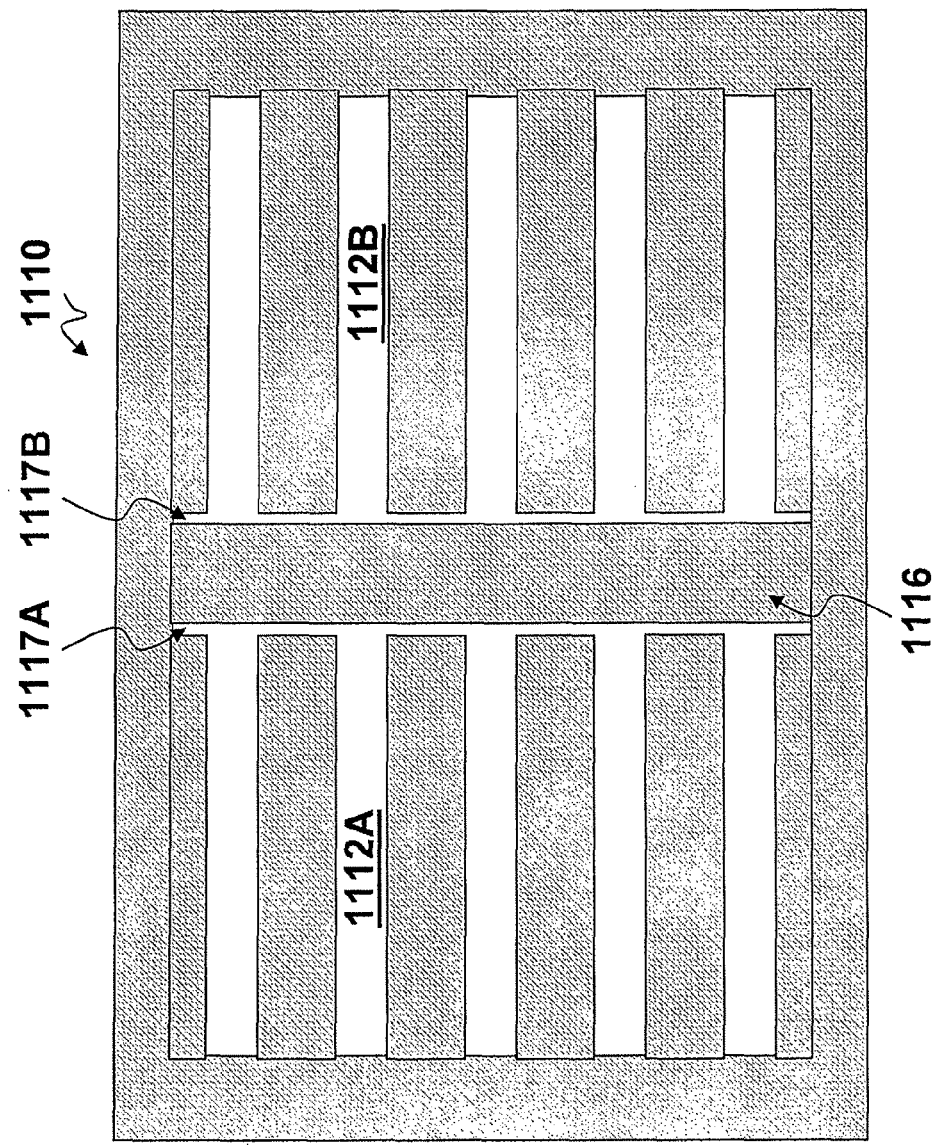
FIG. 11 illustrates a mask in accordance with another mask embodiment described herein that may be used in the method described with reference to FIGS. 1-9.
Figure 12:
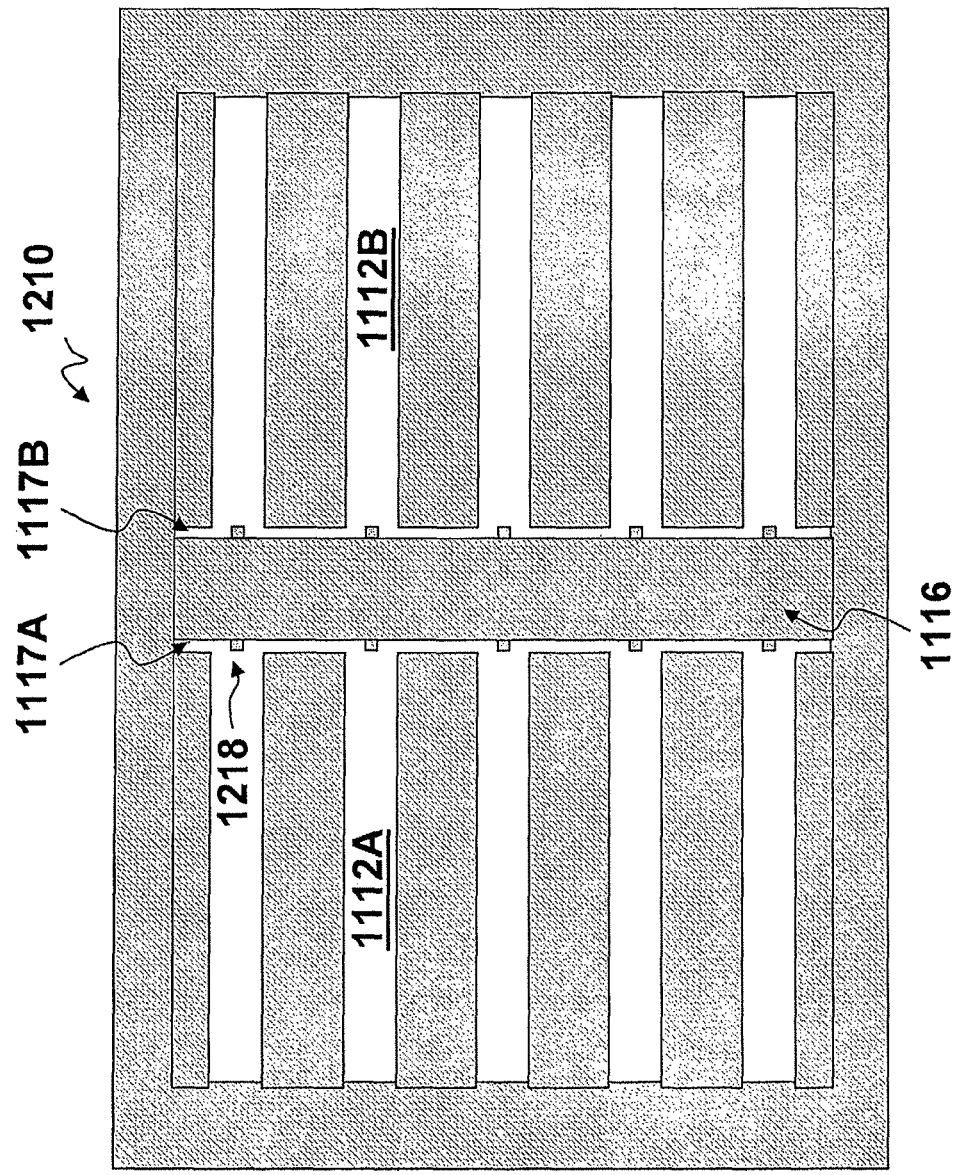
FIG. 12 illustrates a mask in accordance with another mask embodiment described herein that may be used in the method described with reference to FIGS. 1-9.

FIGS. 10, 11, and 12 each show further embodiments of masks 1010, 1110, 1210, respectively, that may be used in the method described above in FIGS. 1-9. The mask 1010 of FIG. 10 includes a number of elongated apertures 1010A, 1010B, separated by and extending away from a central solid portion 1016 of the mask 1010. The mask 1110 of FIG. 11 includes a number of elongated apertures 1112A, 1112B, extending away from a central solid portion 1116 of the mask 1110, and joined together at one end by a connecting aperture portion 1117A, 11117B. The mask 1210 of FIG. 12 is similar to the mask 1110 of FIG. 11, except that it also includes a number of protrusions 1218 arranged at the intersection of the apertures 1110A, 1110B and the central portion 1116.

By the embodiments described above, the limitations imposed on the size of patterns made by photolithographic techniques may be overcome and patterns smaller than the minimum pitch for a given mask may be produced. The patterns may then be formed into features such as vias and filled with conductive material to form electrical connections that are smaller than connections that could be produced using a single mask.

The above description and drawings are only to be considered illustrative of specific embodiments, which achieve the features and advantages described herein. Modifications and substitutions for specific conditions and materials can be made. Accordingly, the embodiments are not considered as being limited by the foregoing description and drawings, but is only limited by the scope of the appended claims.

What is claimed as new and desired to be protected by Letters Patent of the United States is:

1. A method of forming a pattern in a material, the method comprising:
    exposing at least two first portions of a first material to radiation through at least two apertures of a mask arranged over the first material;
    shifting the mask so that the at least two apertures overlap a portion of the at least two first portions of the first material; and
    exposing at least two second portions of the first material to radiation through the at least two apertures, wherein the first portions and the second portions overlap in such a way that at least two portions of the first material remain non-exposed after the step of exposing the at least two second portions, the at least two non-exposed portions of the first material being arranged such that at least one non-exposed portion is located between the at least two first portions, at least one non-exposed portion is located between the at least two second portions, and none of the non-exposed portions is disposed between both first and second portions; and
    removing the non-exposed portions or exposed portions of the first material.

2. The method of claim 1, wherein the removing act forms a plurality of openings in the first material.

3. The method of claim 2, wherein a second material is provided below the first material and said method further comprises etching the second material through the openings in the first material to form a plurality of features in the second material.

4. The method of claim 1, wherein shifting the mask comprises shifting the mask horizontally and vertically.

5. The method of claim 1, wherein removing the non-exposed portions of the first material comprises exposing the non-exposed portions of the first material to a solvent to dissolve the non-exposed portions of the first material.

6. The method of claim 1, wherein the first material is a photoresist material.

7. The method of claim 1, wherein the at least two apertures are mirror images of each other.

8. The method of claim 1, wherein each of the at least two apertures include a plurality of substantially horizontal apertures spaced apart from each other and a substantially vertical aperture overlapping ends of the substantially horizontal apertures.

9. The method of claim 8, wherein the width of the horizontal apertures is larger than the distance separating the horizontal apertures.

10. The method of claim 8, wherein the mask is shifted in a horizontal and vertical direction such that the second portions of the of the first material formed through the horizontal apertures overlap the areas between the first portions of the first material formed through the horizontal apertures.

11. The method of claim 8, wherein the height of the removable portions of the first material is equal to the distance separating the horizontal apertures.

12. A method of forming openings in a material to be patterned, the method comprising:
    exposing a photoresist material over a material to be patterned through at least two apertures of a mask over the photoresist material during a first exposure to form first portions of the photoresist material;
    shifting the mask vertically and horizontally so that the at least two apertures overlap a portion of the first portions;
    exposing the photoresist material through the at least two apertures during a second exposure to form second portions of the photoresist material;
    removing removable portions of the photoresist located between the overlapping first portions and second portions of the photoresist to form openings in the photoresist material; and
    etching the material to be patterned through the openings in the photoresist to form a plurality of openings in the material to be patterned.

13. The method of claim 12, wherein the openings are vias.

14. The method of claim 13, further comprising filling the vias with conductive material to form a plurality of electrical connections.

15. The method of claim 12, wherein the at least two apertures are mirror images of each other.

16. The method of claim 12, wherein each of the at least two apertures include a plurality of substantially horizontal apertures spaced apart from each other and a substantially vertical aperture overlapping ends of the substantially horizontal apertures.

17. The method of claim 16, wherein the width of the horizontal apertures is larger than the distance separating the horizontal apertures.

18. The method of claim 16, wherein the mask is shifted in a horizontal and vertical direction such that the second portions of the of the first material formed through the horizontal apertures overlap the areas between the first portions of the first material formed through the horizontal apertures.

19. The method of claim 16, wherein the height of the removable portions of the first material is equal to the distance separating the horizontal apertures.

20. The method of claim 12, wherein removing the removable portions of the photoresist comprises exposing the photoresist to a solvent to dissolve the removable portions of the photoresist.

* * * * *

UNITED STATES PATENT AND TRADEMARK OFFICE
CERTIFICATE OF CORRECTION

PATENT NO. : 8,512,938 B2  Page 1 of 1
APPLICATION NO. : 12/815181
DATED : August 20, 2013
INVENTOR(S) : Anton DeVilliers et al.

It is certified that error appears in the above-identified patent and that said Letters Patent is hereby corrected as shown below:

In the Specification

In column 5, line 26, in Claim 10, delete "of the of the" and insert -- of the --, therefor.

In column 6, line 28, in Claim 18, delete "of the of the" and insert -- of the --, therefor.

Signed and Sealed this
Twenty-ninth Day of October, 2013

Teresa Stanek Rea
*Deputy Director of the United States Patent and Trademark Office*